United States Patent [19]

Seidler

[11] Patent Number: 5,030,144
[45] Date of Patent: Jul. 9, 1991

[54] SOLDER-BEARING LEAD

[75] Inventor: Jack Seidler, Flushing, N.Y.

[73] Assignee: North American Specialties Corporation, Flushing, N.Y.

[21] Appl. No.: 510,004

[22] Filed: Apr. 13, 1990

[51] Int. Cl.⁵ .............................................. H01R 4/02
[52] U.S. Cl. ...................................... 439/876; 439/83; 439/885; 29/874
[58] Field of Search ................. 439/83, 876, 885–887; 29/874

[56] References Cited

U.S. PATENT DOCUMENTS 4,183,611  1/1980  Casciotti et al. ..................... 439/876
4,618,209  10/1986  Sonobe .............................. 439/83 X

FOREIGN PATENT DOCUMENTS 1082645  2/1960  Fed. Rep. of Germany ........ 29/874

Primary Examiner—Eugene F. Desmond
Attorney, Agent, or Firm—Darby & Darby

[57] ABSTRACT

A solder-bearing lead adapted to be soldered to a conductive surface comprising an elongated body portion having a solder-bearing portion, a terminal portion, and a middle portion disposed between said solder-bearing portion and said terminal portion. The solder-bearing portion includes a pair of projections extending from one edge of said body portion and forming a gap therebetween dimensioned to receive a solder mass. A region of the middle portion is twisted so that the projections lie in a plane substantially perpendicular to the plane of the terminal portion. The solder-bearing lead can be used as an edge clip for mounting a substrate such as a printed circuit board/or as a surface-mounted lead for a substrate.

23 Claims, 4 Drawing Sheets

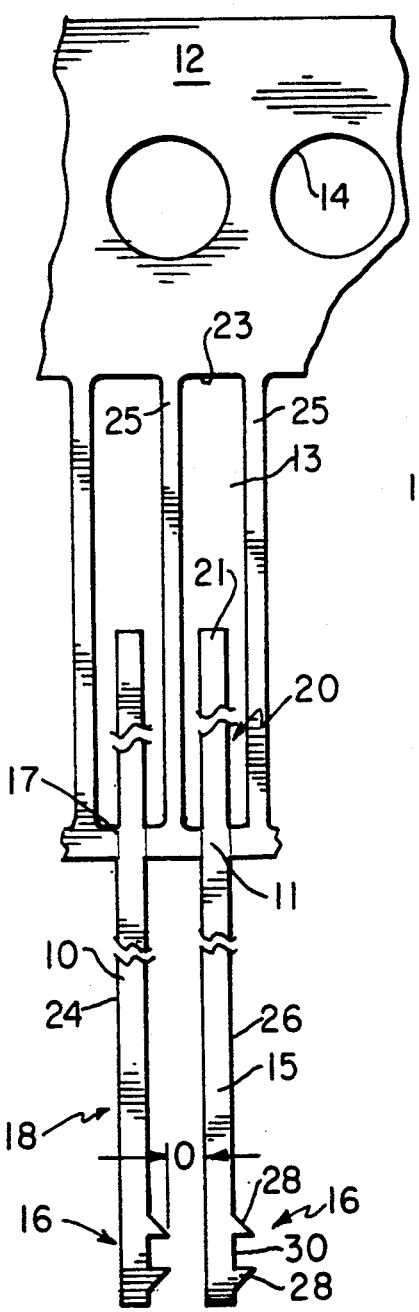
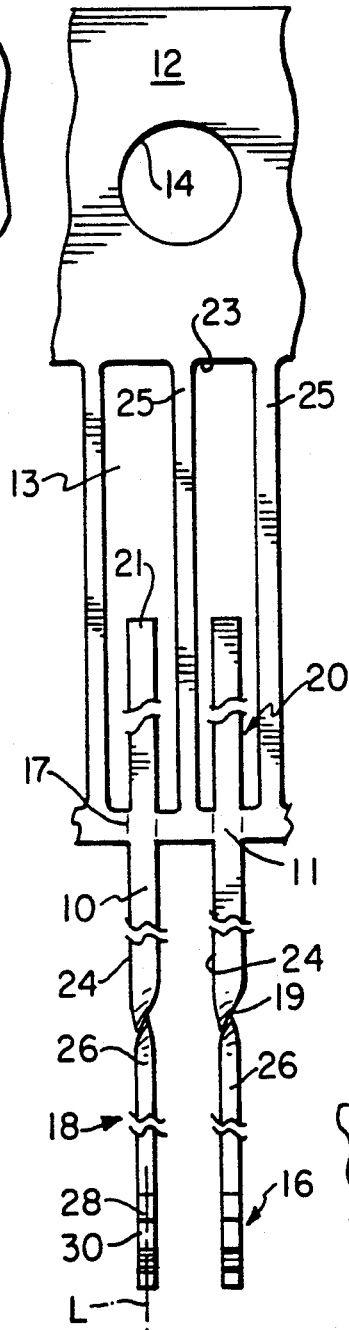
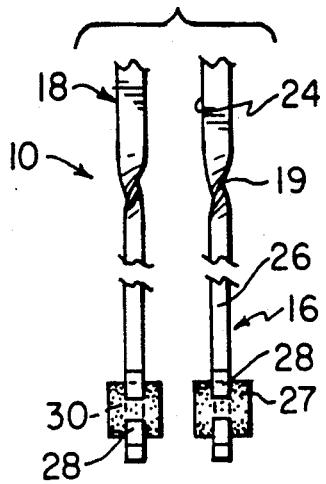
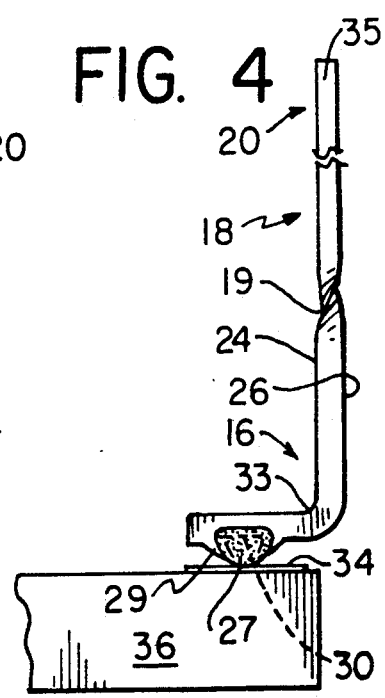
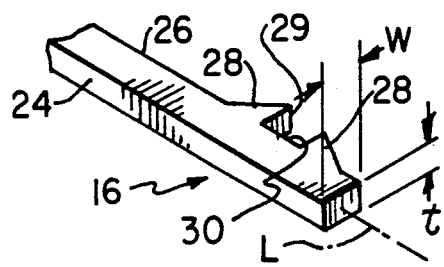
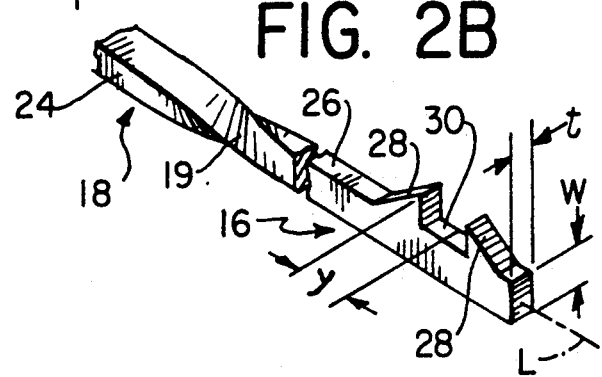

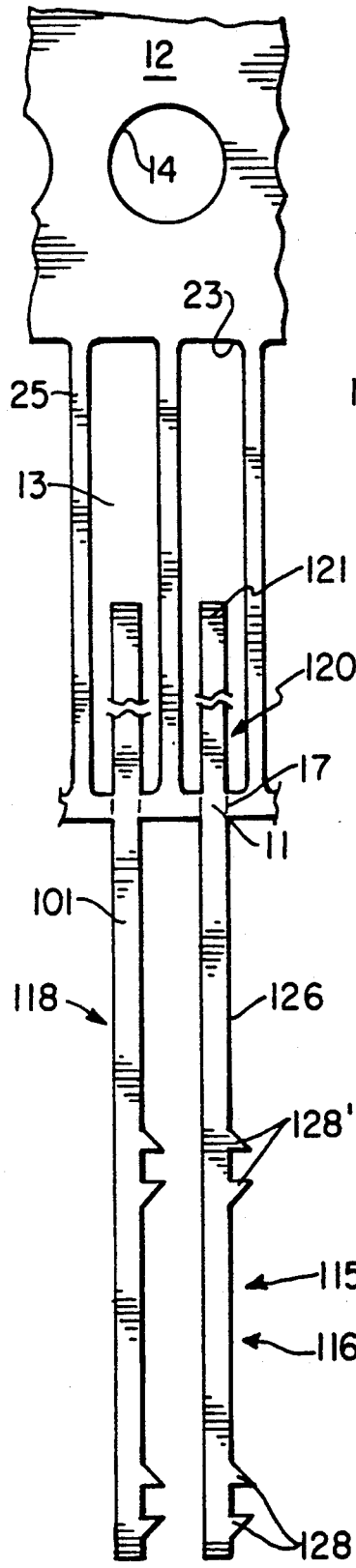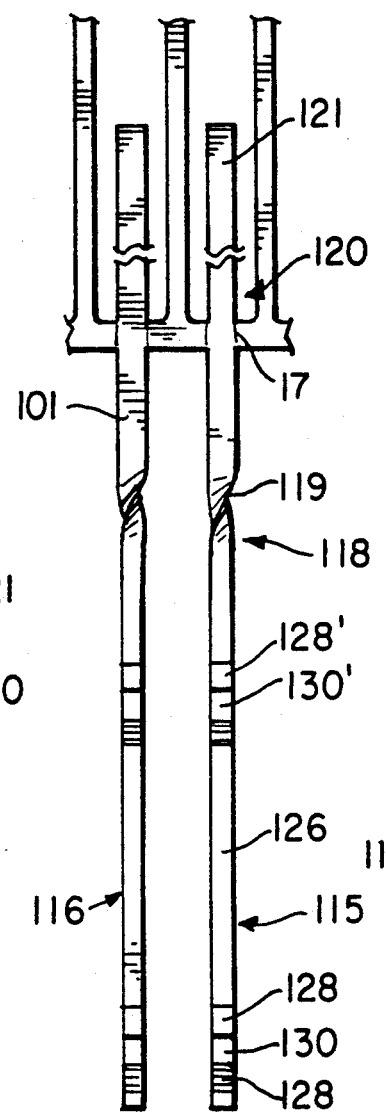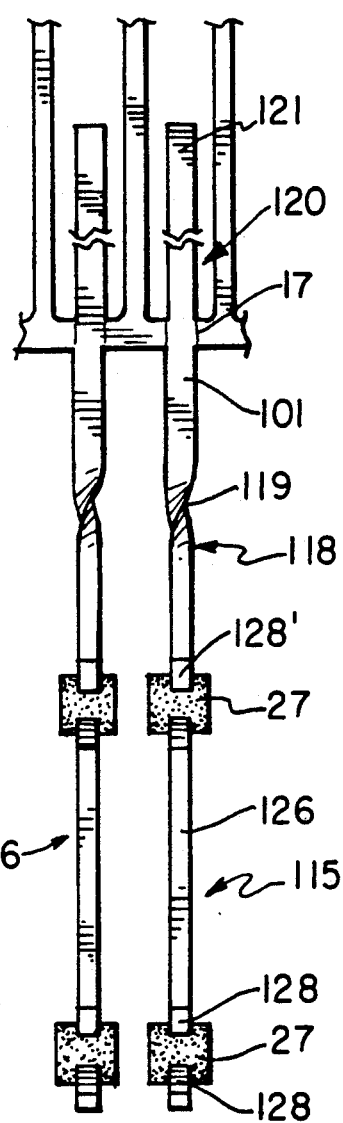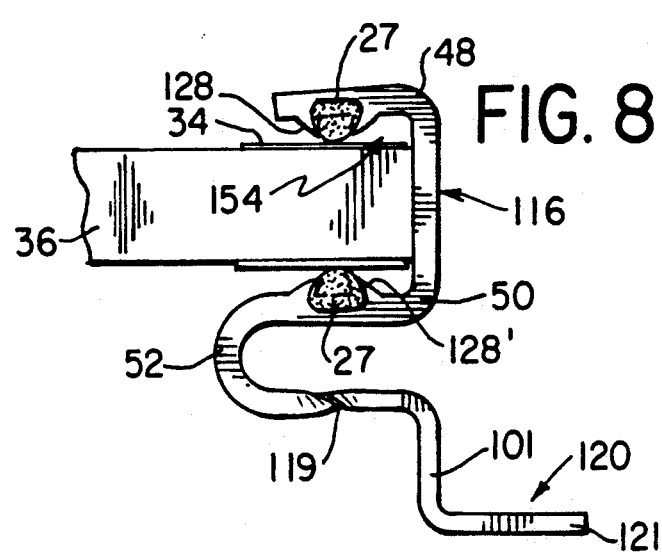

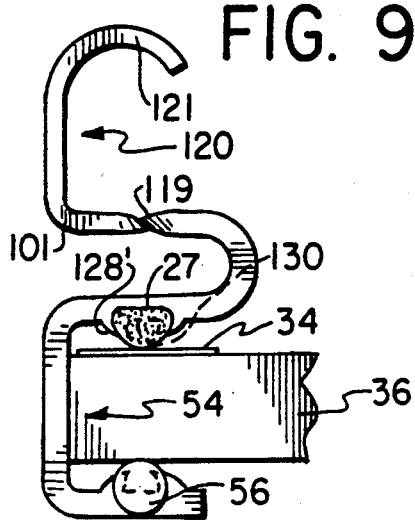
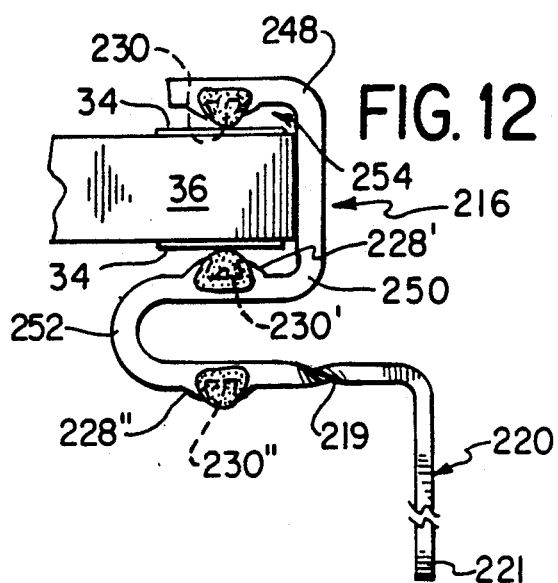
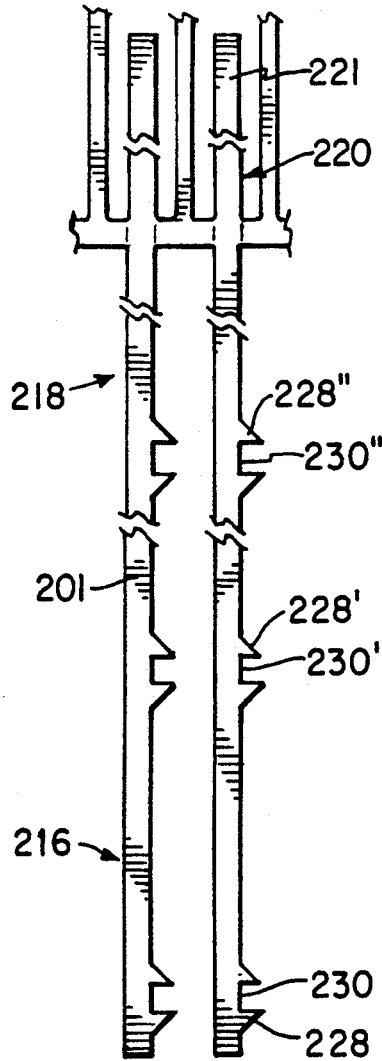
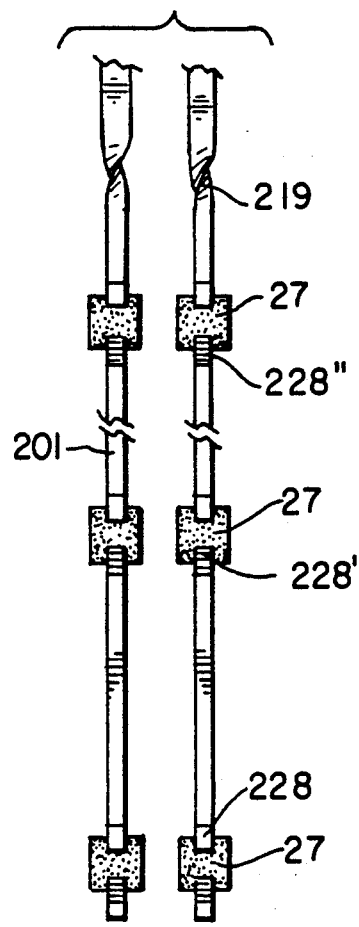

SOLDER-BEARING LEAD

BACKGROUND OF THE INVENTION

1. Field of the Invention

This invention relates to solder-bearing contacts and leads for attachment to contact pads on substrates such as electronic circuit boards, chip carriers, or the like.

2. Description of the Related Art

In the electronic equipment industry, it is known to provide leads for connection to contact pads of printed circuit boards and other substrates by soldering the leads thereto. See, e.g. U.S. Pat. Nos. 4,728,305 and 4,597,628. However, as the electronic industry continues to move toward greater miniaturization, the size and spacing between the contact pads has accordingly been reduced. This requires a corresponding reduction in the size and spacing of the leads which are to be connected to contact pads.

However, in attempting to reduce the spacing between leads, it is also important to provide sufficient spacing to prevent inadvertent contact or arcing between adjacent leads.

The objective of size/space reduction of the leads must be achieved without sacrificing accuracy in manufacture of the leads. It is also desirable to provide rapid assembly of multiple leads. Prior construction and manufacturing processes of leads have been unable to achieve effectively the required reduced size and spacing.

Thus, the need exists for effectively applicable leads of reduced size and spacing to accommodate the current reduction in the size and spacing of contact pads of substrates, but sufficiently spaced to prevent arcing. The need also exists for a method of manufacturing such leads without sacrificing accuracy.

SUMMARY OF THE INVENTION

The present invention overcomes the problems and deficiencies of the prior art by providing solder-bearing leads of reduced size and spacing to accommodate current reductions in the size and spacing of contact pads of printed circuit boards or other substrates. The solder-bearing portion of the lead of the present invention includes a pair of projections extending from one edge to form a gap therebetween which is dimensioned to receive and retain a solder mass. A region of a portion of the lead is twisted so that the edge of the solder-bearing portion containing the projections is bent so that the projections lie in a plane substantially perpendicular to the plane of the remaining portion. Since the thickness of the lead when formed is less than its width, the twisting of the solder bearing portion results in a lesser width of that portion adapted to contact the substrate and permits closer spacing of leads. A solder mass is placed within the projections of the solder-bearing portion to provide electrical bonding between the lead and the substrate. The solder-bearing lead can be used inter alia as an edge clip for mounting a substrate or for surface mounting the substrate. The solder-bearing lead can advantageously be made by automatic progressive stamping of blanks at high speed and simple twisting of the lead. The leads may be readily configured to be attached to a carrier strip and for group attachment to a substrate, with provision thereafter to remove the solder-bearing portion from the remaining body portion of the lead.

BRIEF DESCRIPTION OF THE DRAWINGS

The objects, features, and advantages of the present invention will be more completely disclosed with reference to the following detailed description of presently preferred embodiments of the present invention, taken with the attached drawings, in which:

FIG. 1A shows a plan view of a strip formed into flat blanks for use in making one embodiment of the lead of the present invention;

FIG. 1B shows an isometric view of an end portion of the lead of FIG. 1A;

FIG. 2A shows a plan view of the leads of FIG. 1 having a twist in accordance with the present invention;

FIG. 2B shows an isometric view of an end portion of the twisted lead of FIG. 2A;

FIG. 3 shows a plan view of leads of FIG. 2A each retaining a solder mass;

FIG. 4 shows a side sectional view of a lead as in FIG. 2 shown retaining a solder mass and bent into a configuration for surface mounting to a substrate;

FIG. 5 shows a plan view of a modified form of the stamped blank for use in making another embodiment of the lead of the present invention;

FIG. 6 shows a plan view of the lead of FIG. 5 each having a twist in accordance with the present invention;

FIG. 7 shows a plan view of the lead of FIG. 6 each retaining two solder masses;

FIG. 8 shows a side view of a lead as in FIG. 7 bent into a configuration to form a clip for a substrate;

FIG. 9 shows a side view of a lead as in FIG. 7 bent into an alternate configuration to form a clip for a substrate;

FIG. 10 shows a plan view of another modified form of stamped blank for use in making yet another embodiment of the lead of the present invention;

FIG. 11 shows a plan view of a portion of the leads of FIG. 10 each having a twist in accordance with the present invention and retaining solder masses;

FIG. 12 shows a side view of a lead as in FIG. 11 bent into a configuration to form a clip for a substrate and for surface mounting to another substrate;

DETAILED DESCRIPTION OF THE PREFERRED EMBODIMENTS

Figure 13:
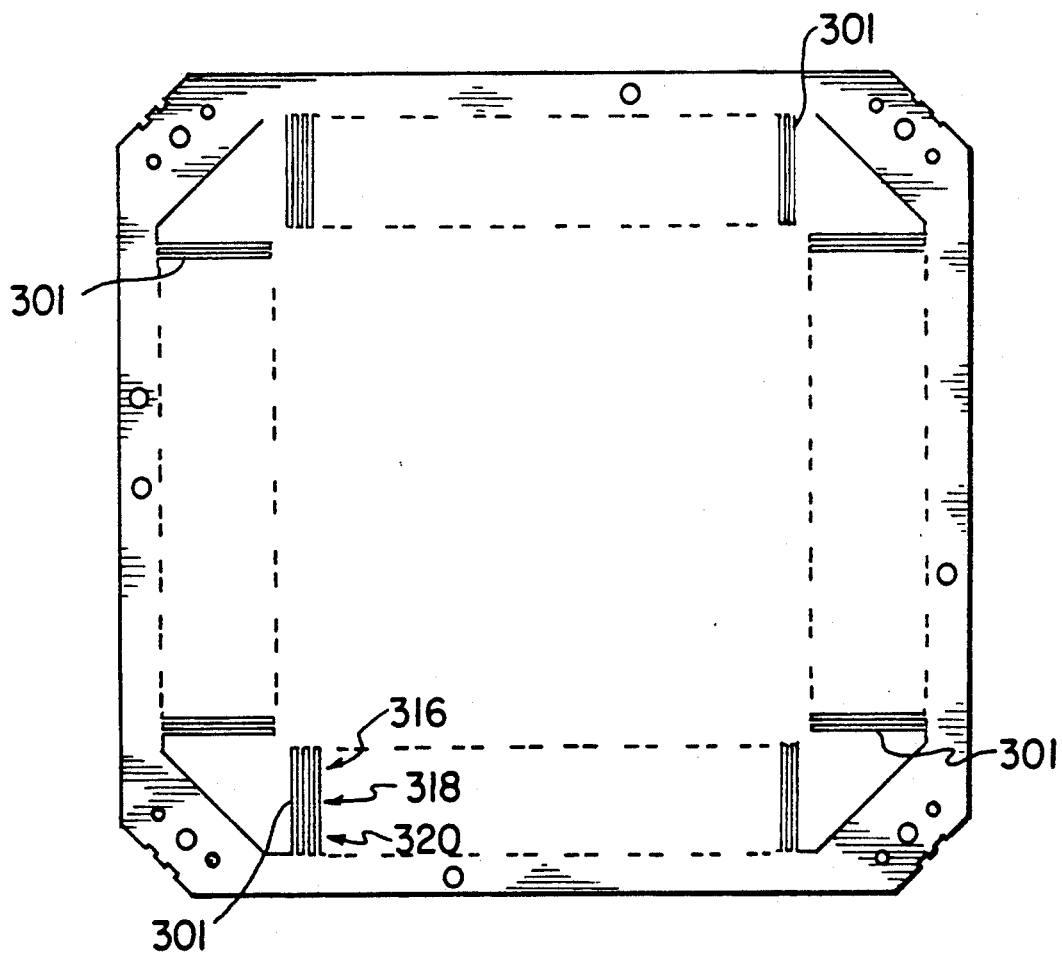
FIG. 13 shows a top plan view of a rectangular-shaped frame of leads according to the present invention for surface mounting to a chip or chip carrier.

Referring now to the drawings, wherein like reference numerals represent identical or corresponding parts throughout the several views, FIG. 1A illustrates a stamped strip having a sequence of side-by-side individual blanks 10 for the leads of the invention, formed by stamping from a conductive strip, such as of beryllium copper or like resilient conductive material. The individual blanks 10 extend from a carrier strip 12. Strip 12 is shown with sprocket holes 14 for indexing the blanks 10 step-by-step through subsequent progressive stamping steps for forming the blanks into final form.

The blanks 10 are adapted to be removed, in region 11, preferably by scoring along score lines 17, from carrier strip 12 after joining to a substrate. They are shaped to form the leads of the present invention and to receive a solder mass or slug for mounting to substrates such as printed circuit boards, chips, chip carriers or the like. The broken lines of the carrier strip 12 of FIG. 1A indicate that although only two blanks for forming leads are shown, any number of blanks can be provided side by side along carrier strip 12.

The entire blank 10, when formed (stamped) as shown in FIG. 1A, lies in the same plane as carrier strip 12. The width w of the leads 10 may be only slightly greater than their thickness t (FIG. 1B), which as will become apparent from the discussion below, advantageously provides a reduced width portion when the leads are twisted out of the plane of the remaining portion of the blank.

As shown in FIGS. 1A and 2A, the leads are preferably attached to the carrier strip 12 so a portion 21 extends into the space 13 between the parallel strips 25 of material, thereby reducing the length of the lead which would otherwise extend from the carrier strip 12. The lead can extend through the entire space 13 up to edge 23 of strip 12, if desired. Securement at a central region of the lead also advantageously provides sufficient rigidity during manufacturing and shaping.

The blank leads 10 are identical and each is formed of an elongated body portion 15 of sufficient length for the intended use of the lead. Body portion 15 has parallel left and right side edges 24, 26, respectively and includes a solder-bearing portion 16, a middle portion 18, and an end portion 20 attached to carrier strip 12. The designation of right and left side edges is for convenience of description only, since if the orientation of the lead is changed, the side edge references will change as well.

Lead 10 further includes a pair of extensions 28 protruding from the right side edge 26 of solder-bearing portion 16. (For clarity, all the labels do not appear on each lead.) Of course, the extensions 28 can alternatively protrude from the left side edge 24. Each protrusion 28 is preferably right-triangular shaped and is spaced apart from the matching protrusion 28 to form a gap 30 therebetween. The gap 30 is dimensioned to have a width y substantially equal to the width of a solder wire to be placed therein, as described below. Obviously, the protrusions can be other shapes beside triangular so long as they achieve the function of creating a sufficient gap for receiving the solder mass and are shaped to be able to retain the solder mass therein.

FIGS. 2A, 2B show leads 10 twisted about their longitudinal axis L at middle portion 18, and specifically at region 19, through an approximate 90 degree angle, so that the projections 28, as well as the entire solder-bearing portion 16, lie in a plane substantially perpendicular to the plane of end portion 20. The lead 10 is twisted so that the right side edge 26 is bent upward as seen in FIGS. 2A and 2B. After twisting, the solder-bearing portion 16 remains substantially aligned with the longitudinal axis L of body portion 15. By twisting the solder-bearing portion 16 which, like the remaining body portion 15, has a thickness t less than its width w, the width of the solder-bearing portion is in effect reduced since the new width, measured as the distance between the side edges, now corresponds to the thickness t (see FIG. 2B). This provides a greater spacing between leads without reducing the pitch (or number of leads per inch) along the carrier strip.

As shown in FIG. 3, a solder mass 27 is placed within gap 30. One way of introducing the solder mass 27 in the gap is to place an integral solder wire (not shown) between the horizontally aligned gaps 30 of a row of leads 10 and then to cut the wire between adjacent gaps to leave a shorter, but sufficiently sized, section of solder wire therebetween. This is described in U.S. Pat. Nos. 4,597 628, and 4,728,305, both of which are herein incorporated by reference. The solder mass 27 may be flush with the outer gap of channel 30 or may extend above the channel, as disclosed in U.S. Pat. No. 4,728,305. Furthermore the tips 29 of the projections 28 may be bent inwardly into or to partially encircle the solder mass 27 to improve retention.

In FIG. 4, the solder-bearing portion 16 of the lead 10 is bent at region 33 at an approximate right angle to the end portion 20. The solder mass 27, retained within gap 30 of solder bearing portion 16, may be placed in contact with a conductive pad 34 on a surface of a substrate 36, such as a printed circuit board, and then heated to melt the solder, to provide electrical contact between lead 10 and pad 34 on cooling. The terminal end 35 of the end portion 20 of the lead 10 may be suitably formed in any desired one of a number of ways for connection to other equipment, such as being formed as a pin for insertion into a contact receptacle, or as a wire-wrap post termination.

FIG. 5 shows a modified form of a stamped strip 12 carrying a sequence of blanks for forming leads 101. In this embodiment, each lead blank 101 is provided with two sets of projection pairs 128, 128' extending from the right side edge 126 of the body portion 115. Extensions 128' are identical to extensions 128 and each pair are spaced apart to form a gap 130, 130' therebetween, similar to gap 30, to receive solder mass 27.

The end portion 120 includes an extended portion 121 extending beyond the score lines 17 for formation of fingers discussed below.

As shown in FIGS. 6 and 7, each lead 101 includes a twisted portion 119 in its middle portion 118, so that extensions 128, 128', as well as the entire solder-bearing portion 116, lie in a plane substantially perpendicular to the plane of the end portion 120. Solder mass 27 is retained within gaps 130, 130', as in FIG. 3, and lead 101 can be used for electrical connection with planar conductive areas on a substrate. As shown in FIG. 8, lead 101 is arranged as a clip for mounting a substrate. The solder-bearing portion 116 of lead 101 is bent at 48, 50 and 52, (forward of twist 119), into a substantially reverse S-shaped configuration to form a channel 54 between the solder retaining projections 128, 128'. Substrate 36, having conductive pads 34 on its opposing surfaces, may be retained within channel 54 for soldering to lead 101. Alternately, a conductive pad may be omitted or an insulating pad can be provided instead of one of the conductive pads 34 if connection to only one of the surfaces of the substrate is desired. Extended portion 121 of end portion 120 is bent to form a finger extending in the direction away from the channel 54 and is suitably formed to be connected to other equipment.

In an alternate arrangement of lead 101, illustrated in FIG. 9, the finger which is formed from extension 121 of end portion 120, is hook-shaped and extends in the same direction as channel 54. Like the finger of FIG. 8, it is adapted to be connected to other equipment. In the embodiment of FIG. 9, substrate 34 is shown having only one conductive pad 34 which abuts solder mass 27 placed in gap 130' between projections 128'. A non-conductor 56 may replace one of the solder masses where it is desired to insulate the lead from one surface (e.g. the lower surface) of the substrate. This type of mounting is used when it is desired to make electrical contact with only one surface of the substrate. Of course, if desired, two conductive pads can be provided as in the arrangement of FIG. 8.

FIG. 10 shows a fragmentary portion of a modified stamped blank carrying a sequence of blanks for forming leads. In this embodiment, each lead blank 201 is provided with three pairs of projections 228, 228', 228", extending from the right side edge 226 of blank 201. The projections 228, 228', 228" of each pair are spaced apart from one another, so that each pair forms a gap 230, 230', 230", respectively, therebetween to receive a solder mass 27. FIG. 11 shows the lead 201 twisted in region 219 of its middle portion 218 so that all of the projections 228, 228', 228" (and the entire solder-bearing portion 216) lie in a plane substantially perpendicular to the plane of the end portion 220 of the lead 201. Solder mass 27 is shown retained in each gap.

FIG. 12 illustrates one arrangement of the triple-projection lead 201 of FIG. 11, showing an example of its many uses. The solder bearing portion 216 of lead 201 is bent at regions 248, 250 and 252 into a substantially reverse S-shaped configuration. Gaps 230, 230' face one another to form a channel 254 which may receive a substrate 36 therebetween and gap 230" is adapted for receiving a solder mass for surface mounting a substrate. Extended portion 221 of end portion 220 may form an additional terminal, or be removed if desired.

FIG. 13 illustrates a rectangular array of leads 301, (the dotted lines indicating a continuous row of solder bearing leads not separately depicted), each having the twist of the present invention, for surface mounting to a chip carrier or other substrate having conductive pads or elements in a cooperating rectangular array. This arrangement thus allows easy simultaneous mounting of multiple leads to such a substrate. Each of the leads 301 has a construction as in FIG. 2B, with a pair of projections extending from solder bearing portion 316 and twisted in middle portion 318 so that the projections lie in a plane perpendicular to the plane of end portion 320. A solder mass is inserted into each gap formed between each pair of the projections and is heated and then cooled to provide good electrical contact between the leads and conductive pads or elements of the substrate.

As can be seen in all the embodiments of the lead, a reduction in pitch and spacing of the leads can be achieved in manufacture. That is, since the projections extend from only one side edge of the lead, closer side-by-side arrangement (see distance D in FIG. 1A) of the leads can be obtained in manufacture of the blanks.

Additionally, the blanks are formed so that the thickness of each lead is less than its width. Consequently when the solder-bearing portion is, twisted out the plane of the remaining portion of the lead so that it lies substantially perpendicular to the plane of the end portion, a reduction in width of the solder-bearing portion is advantageously achieved. For example, in one embodiment, the width of the original blank measured from its right side edge to its left side edge may be 0.007 inch and the thickness of the blank, measured from its upper surface to its lower surface, may be 0.005 inch. Thus, when the solder-bearing portion is twisted to its perpendicular position, the new width of the solder-bearing portion, measured as the distance between its new right and left side edges, is 0.005 inch. This provides a desirable increased distance between leads without reducing their pitch. In another embodiment, the width may be 0.008 inch and the thickness may be 0.006 inch. Obviously, these dimensions are provided only by way of example, as leads with other dimensions are clearly contemplated by the present invention.

In forming the lead, the blank is stamped so that each blank has a pair of substantially parallel right and left side edges and at least one pair of projections extending from one of its side edges. A middle portion of the lead is then twisted so that the projections lie in a plane substantially perpendicular to the plane of the opposing end portion of the lead. The solder mass is placed within the gap between the pair of projections to provide electrical contact with the substrate. The lead is subsequently separated from its carrier strip.

The solder-retaining arrangements of the leads of the present invention described above will be understood to be by way of example only, since numerous other arrangements are possible, depending on the desired mounting of the substrates. Moreover, an additional number of projections other than the number shown in the above examples could be provided.

While the above embodiments show a pair of projections (28 or 128 or 228 etc.) for retaining the solder mass, a single projection may be used which is longer than the height of the solder mass, and bent over a portion of the solder mass to hold it in place. This single projection construction can be used in any of the solder-retaining arrangements described above.

It will be understood that the solder-retaining arrangement of the present invention is suitable for many other applications, where it will have the advantages discussed above as well as others. Accordingly, the above embodiments are to be deemed illustrative only, and within the scope of the appended claims, the present invention may be practiced otherwise than as specifically described herein.

What is claimed is:

1. A lead adapted to be soldered to a conductive surface, comprising:
   an elongated body having first and second side edges, and including a first portion adapted to retain solder, a substantially flat terminal portion, and a middle portion disposed between said first portion and said terminal portion,
   said first portion including a pair of co-planar projections extending from said first edge of said body and forming a gap therebetween dimensioned to receive a solder mass;
   a region of said body being twisted about a longitudinal axis of said middle portion so that said first portion and projections lie in a plane substantially perpendicular to the plane of said terminal portion.

2. A lead as recited in claim 1, wherein said first portion is bent toward said terminal portion at a substantially right angle for mounting to a substrate.

3. A lead as recited in claim 2, wherein said terminal portion is bent outwardly from said body.

4. A lead as recited in claim 1, further comprising a solder mass retained in said gap.

5. A lead as recited in claim 1, further comprising a second pair of projections extending from said first edge of said first portion, said second pair of projections forming a gap therebetween.

6. A lead as recited in claim 5, wherein said first portion is bent so that said gaps of each of said pairs of projections face one another to form a channel therebetween to mount a substrate.

7. A lead as recited in claim 6, further comprising a solder mass retained in each said gap by its projections.

8. A lead as recited in claim 1, wherein the thickness of said body portion is less than the width of said body portion.

9. A lead as recited in claim 8 wherein said thickness ranges from substantially 0.005 to 0.006 inch and said width ranges from substantially 0.007 to 0.008 inch.

10. A method of forming a lead comprising the steps of:
    forming a flat elongated blank with first and second portions having substantially parallel side edges extending along said first and second portions, and a pair of projections extending laterally from a first side edge of said first portion to form a gap between said projections;
    twisting one portion of said blank relative to the other so that said projections lie in a plane substantially perpendicular to the plane of said second portion of said blank.

11. A method as recited in claim 10, further comprising the step of placing a solder mass in said gap formed between said pair of projections.

12. A method as recited in claim 11, further comprising the step of bending said first portion at a substantially right angle to said second portion.

13. A method as recited in claim 10, wherein the blank is formed with a width greater than the thickness.

14. A method as recited in claim 10, including forming a second pair of projections extending from said first side edge.

15. A lead formed from a blank which comprises an elongated body having first and second edges and also having a solderable portion and a substantially flat terminal portion, the transverse dimension of said solderable portion parallel to said flat portion being less than the width of said flat portion, said solderable portion lying substantially along a longitudinal axis of said body, wherein said solderable portion and said terminal portion are substantially in alignment and in planes substantially perpendicular to one another.

16. A lead comprising a body having first and second edges and also having a solderable portion and a substantially flat terminal portion, the width of said solderable portion being less than the width of said flat portion, said solderable portion lying substantially along a longitudinal axis of said body portion, said body further comprising at least one projection extending from an edge of said solderable portion and adapted to hold a solder mass.

17. A lead as recited in claim 16 comprising a pair of projections extending from an edge of said solderable portion and having a gap therebetween.

18. A lead as recited in claim 17, further comprising a solder mass disposed in said gap.

19. A lead as recited in claim 15, wherein the width of said terminal portion is substantially 0.005 to 0.006 inch and the width of said solderable portion is substantially 0.007 to 0.008 inch,
    said solderable portion being in a plane substantially perpendicular to said flat terminal portion with the thickness of said solderable portion being substantially in the direction of the terminal portion width.

20. A blank for leads for connection to electrical apparatus, comprising an elongated strip of electrically conductive material, one longitudinally extending portion of said strip constituting a carrier portion, said strip also including a series of parallel supporting strips integral with and extending laterally from said carrier portion, and a lead body parallel to and between each pair of consecutive supporting strips, each lead body being supported from the ends of its adjacent supporting strips by severable joins at a point of said body spaced from both ends of said body, so that one portion of said body is between said supporting strips and another portion is not.

21. A blank as in claim 20, wherein said other portion of each said lead body is twisted about its longitudinal axis with respect to said one lead body portion into a plane substantially perpendicular to that of said one portion of said lead body.

22. A blank as in claim 21, wherein the thickness of each said lead body is less than its width, whereby the separation between two adjacent ones of said twisted portions is greater than the separation between said one body portions between said supporting strips.

23. A blank as in claim 21, wherein said twisted body portion has a configuration thereon adapted to retain a solder mass.

* * * * *